(12) United States Patent
Huang et al.

(10) Patent No.: US 10,937,886 B2
(45) Date of Patent: Mar. 2, 2021

(54) SEMICONDUCTOR DEVICE WITH NEGATIVE CAPACITANCE MATERIAL IN BURIED CHANNEL

(71) Applicant: NANYA TECHNOLOGY CORPORATION, New Taipei (TW)

(72) Inventors: Ching-Chia Huang, Taipei (TW); Tseng-Fu Lu, New Taipei (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 128 days.

(21) Appl. No.: 16/297,747

(22) Filed: Mar. 11, 2019

(65) Prior Publication Data

US 2020/0185507 A1 Jun. 11, 2020

Related U.S. Application Data

(60) Provisional application No. 62/775,916, filed on Dec. 6, 2018.

(51) Int. Cl.
*H01L 29/51* (2006.01)
*H01L 29/78* (2006.01)
*H01L 29/423* (2006.01)

(52) U.S. Cl.
CPC ........ *H01L 29/516* (2013.01); *H01L 29/4236* (2013.01); *H01L 29/517* (2013.01); *H01L 29/7827* (2013.01)

(58) Field of Classification Search
None
See application file for complete search history.

(56) References Cited

U.S. PATENT DOCUMENTS

| 2018/0315859 | A1* | 11/2018 | Ramaswamy | ...... H01L 27/1159 |
| 2019/0115444 | A1* | 4/2019 | Bentley | ................. H01L 29/516 |
| 2020/0066726 | A1* | 2/2020 | Fishburn | ............. H01L 29/4236 |

* cited by examiner

*Primary Examiner* — Nicholas J Tobergte
*Assistant Examiner* — Kien C Ly
(74) *Attorney, Agent, or Firm* — CKC & Partners Co., LLC

(57) ABSTRACT

A semiconductor device includes a substrate, at least one trench, an insulating layer, a lower metal layer, a negative capacitance material layer, and an upper metal layer. The trench has an inner surface in the substrate. The insulating layer is disposed on and lining the inner surface of the trench. The lower metal layer is disposed on the insulating layer and partially filling the trench. The negative capacitance material layer is disposed on and lining the insulating layer and the lower metal layer, in which a remained portion of the trench is defined by the negative capacitance material layer. The upper metal layer is disposed on the negative capacitance material layer and filling the remained portion of the trench.

18 Claims, 4 Drawing Sheets

SEMICONDUCTOR DEVICE WITH NEGATIVE CAPACITANCE MATERIAL IN BURIED CHANNEL

CROSS-REFERENCE TO RELATED APPLICATION

This application claims priority to U.S. Provisional Application Ser. No. 62/775,916, filed Dec. 6, 2018, which is herein incorporated by reference.

BACKGROUND

Field of Invention

The present invention relates to a semiconductor device. More particularly, the present invention relates to semiconductor device having a negative capacitance material layer in a buried channel.

Description of Related Art

A DRAM device may include a plurality of buried-channel array transistor (BCAT). The buried-channel array transistor has a longer effective channel length compared with a planar transistor as its gate electrode is buried under a semiconductor substrate, such that the DRAM device may be downsized and the integration density thereof can be increased.

However, the read/write operation speed of the buried-channel array transistor can be affected by the threshold voltage. Specifically, when the threshold voltage of the buried-channel array transistor surpasses a certain limit, the on-current of the buried-channel array transistor is reduced, such that the read/write operation speed is decreased.

Therefore, there is a need to increase the read/write operation speed of the buried-channel array transistor for achieving better DRAM performance.

SUMMARY

The invention provides a semiconductor device. The semiconductor device includes a substrate, at least one trench, an insulating layer, a lower metal layer, a negative capacitance material layer, and an upper metal layer. The trench is disposed in the substrate and having an inner surface. The insulating layer is disposed on and lining the inner surface of the trench. The lower metal layer is disposed on the insulating layer and partially filling the trench. The negative capacitance material layer is disposed on and lining the insulating layer and the lower metal layer, in which a remained portion of the trench is defined by the negative capacitance material layer. The upper metal layer is disposed on the negative capacitance material layer and filling the remained portion of the trench.

In some embodiments of the present invention, the insulating layer is conformally disposed on the inner surface of the trench.

In some embodiments of the present invention, the negative capacitance material layer is conformally disposed on the insulating layer and the lower metal layer.

In some embodiments of the present invention, a top surface of the negative capacitance material layer is coplanar with a top surface of the upper metal layer.

In some embodiments of the present invention, the top surface of the negative capacitance material layer is lower than a top surface of the insulating layer.

In some embodiments of the present invention, the negative capacitance material is in direct contact with the insulating layer and the lower metal layer.

In some embodiments of the present invention, the negative capacitance material layer includes a ferroelectric material.

In some embodiments of the present invention, the ferroelectric material includes hafnium zirconium oxide, barium titanate, zirconate titanate, barium strontium titanate, bismuth lanthanum titanate (BLT), lead zirconate titanate (PZT), and strontium bismuth tantalate (SBT).

In some embodiments of the present invention, the hafnium zirconium oxide is represented by a chemical formula of $Hf_xZr_{1-x}O_2$, in which x is 0.01 to 0.99.

In some embodiments of the present invention, the hafnium zirconium oxide is represented by a chemical formula of $Hf_{0.5}Zr_{0.5}O_2$.

In some embodiments of the present invention, a thickness of the negative capacitance material layer ranges from 1 nm to 5 nm.

In some embodiments of the present invention, a thickness of the negative capacitance material layer ranges from 1.5 nm to 4.5 nm.

In some embodiments of the present invention, the lower metal layer comprises titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN).

In some embodiments of the present invention, the upper metal layer includes titanium nitride (TiN), tungsten (W), aluminum (Al), cupper (Cu), molybdenum (Mo), titanium (Ti), tantalum (Ta), ruthenium (Ru), and a combination thereof.

In some embodiments of the present invention, the insulating layer includes silicon oxide, silicon nitride, and silicon oxynitride.

In some embodiments of the present invention, the semiconductor device further includes a first source/drain region disposed at one side of the trench and a second source/drain region disposed at another side of the trench.

In some embodiments of the present invention, the semiconductor device further includes a bit line contact disposed over the first source/drain region.

In some embodiments of the present invention, a top surface of the bit line contact is higher than the top surfaces of the negative capacitance material layer and the upper metal layer.

In some embodiments of the present invention, the semiconductor device further includes a cell line contact disposed over the second source/drain region.

In some embodiments of the present invention, a top surface of the cell line contact is higher than the top surfaces of the negative capacitance material layer and the upper metal layer.

It is to be understood that both the foregoing general description and the following detailed description are by examples, and are intended to provide further explanation of the invention as claimed.

BRIEF DESCRIPTION OF THE DRAWINGS

The following embodiments are disclosed with accompanying diagrams for detailed description. It is emphasized that, in accordance with the standard practice in the industry, various features are not drawn to scale and are used for illustration purposes only. In fact, the dimensions of the various features may be arbitrarily increased or reduced for clarity of discussion. Like reference numerals denote like features throughout specification and drawings.

For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

The invention can be more fully understood by reading the following detailed description of the embodiment, with reference made to the accompanying drawings as follows.

Figure 1:
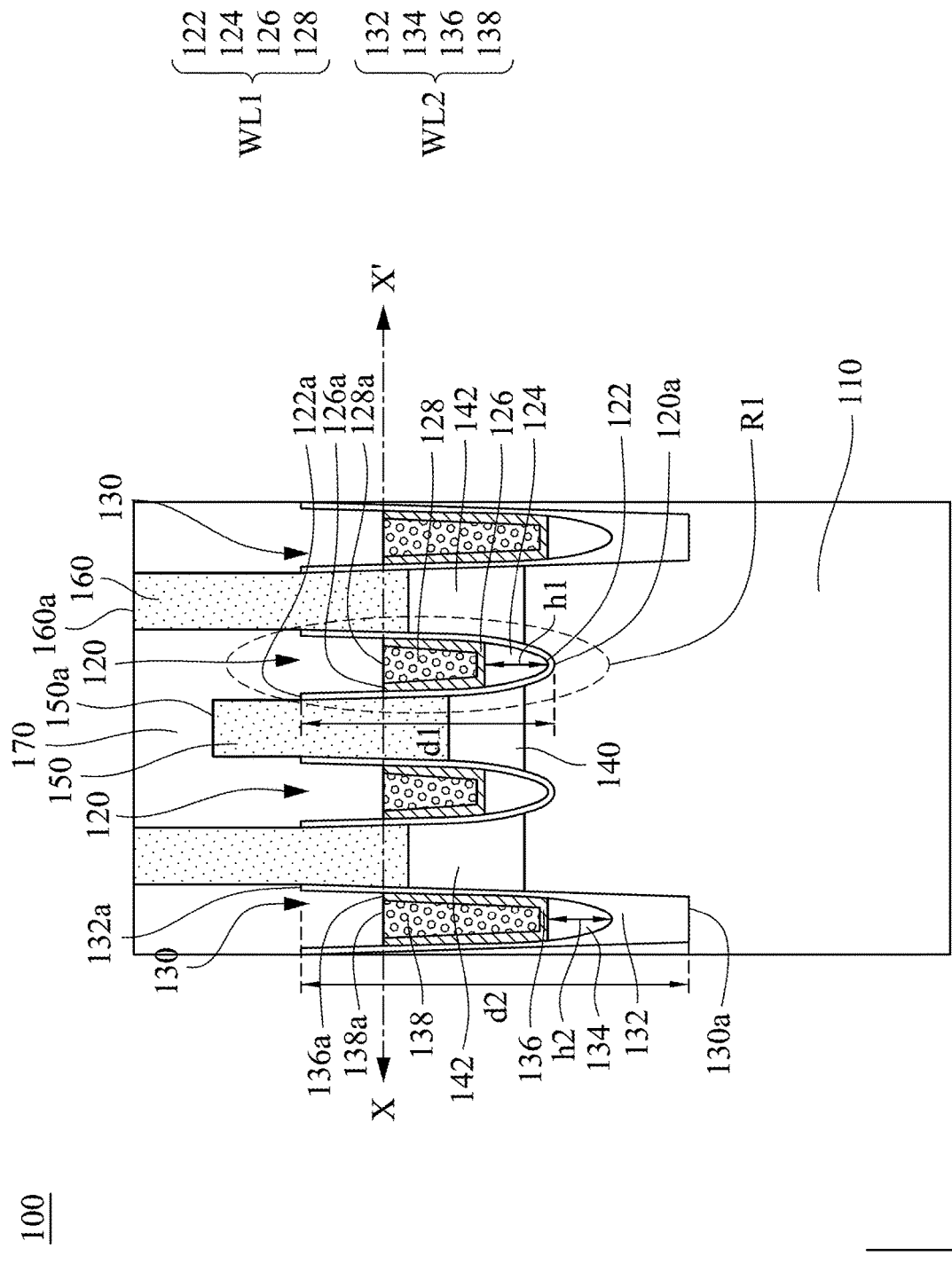

FIG. 1 is a schematic cross-sectional view of a semiconductor device according to various embodiments of this invention.

Figure 2:
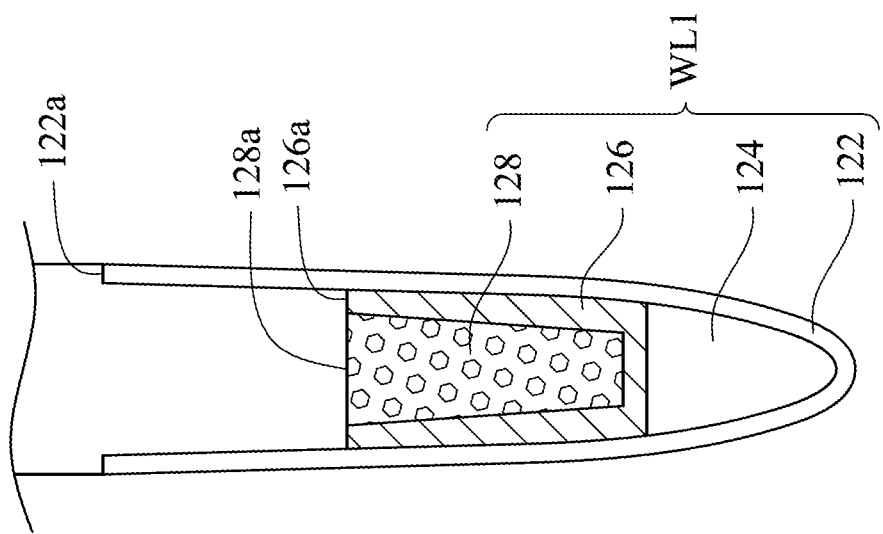

FIG. 2 is an enlarged view of a region R1 in FIG. 1 according to one embodiment of this invention.

Figure 3:
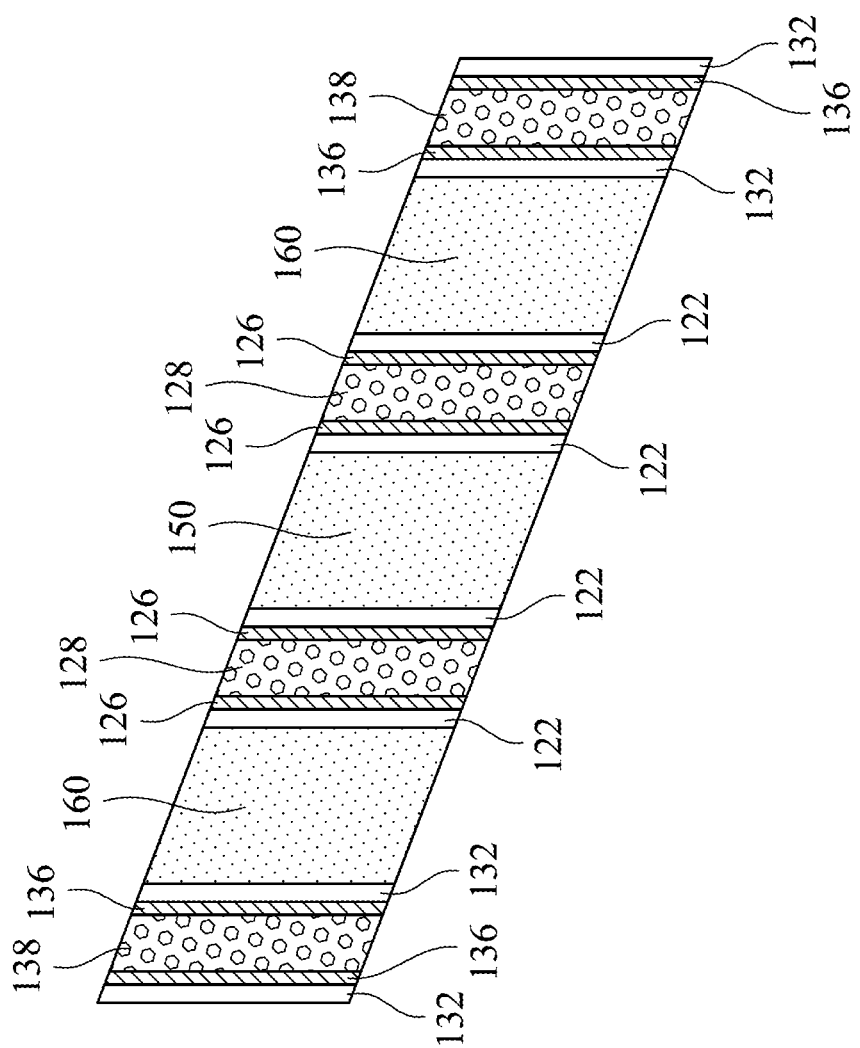

FIG. 3 is a plan view of the semiconductor device in FIG. 1 along cut X-X' according to one embodiment of this invention.

Figure 4:
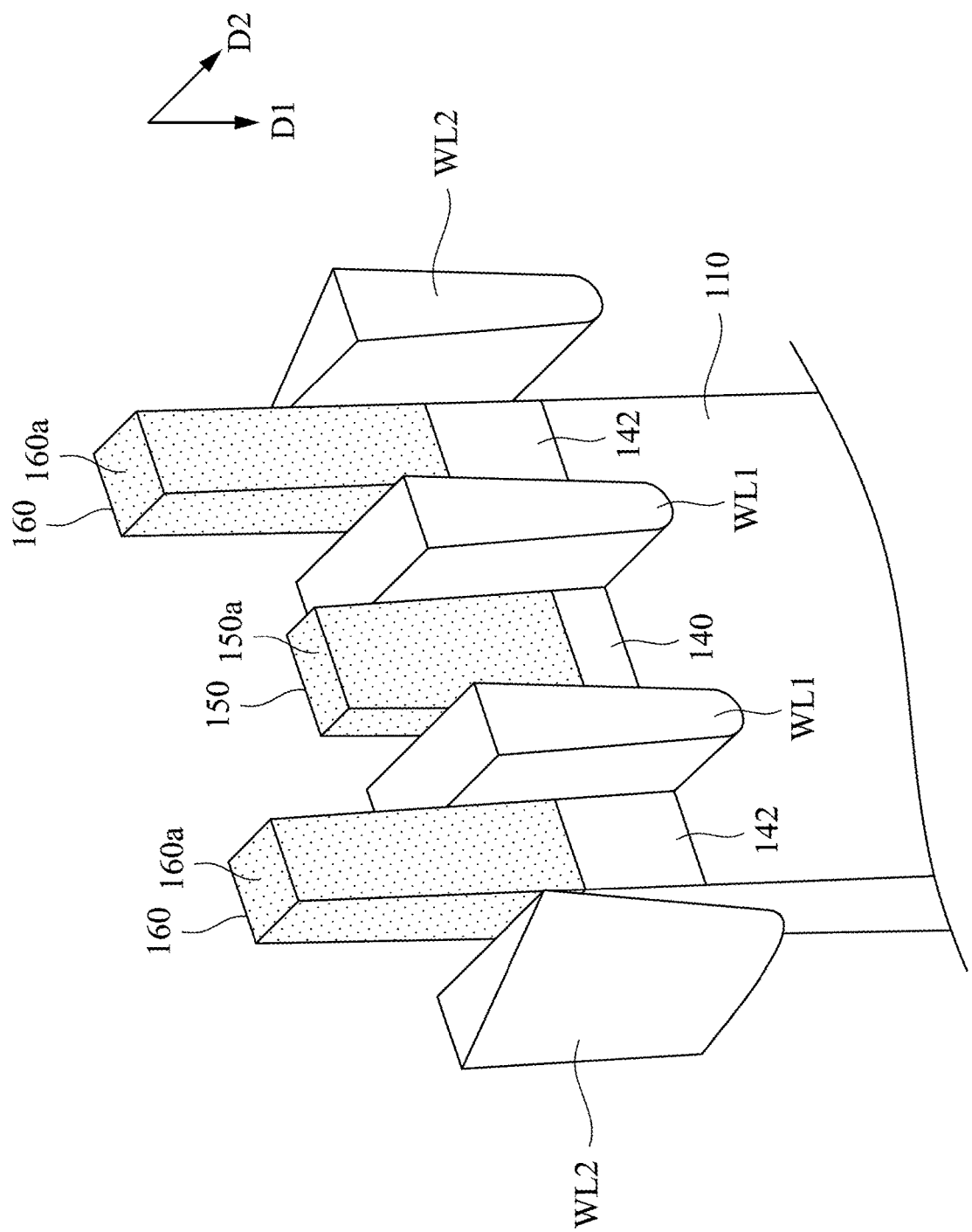

FIG. 4 is a three-dimensional view of the semiconductor device in FIG. 1 according to one embodiment of this invention.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. The terms "at least one" may be understood to include any integer number greater than or equal to one, i.e. one, two, three, four, and etc.

Reference is now invited to FIG. 1 and FIG. 2. FIG. 1 is a schematic cross-sectional view of a semiconductor device 100 according to various embodiments of this invention. FIG. 2 is an enlarged view of a region R1 in FIG. 1 according to one embodiment of this invention.

The semiconductor device 100 includes a substrate 110, at least one first trench 120, at least one second trench 130, a first source/drain region 140, and at least one second source/drain region 142. In some embodiments of the present invention, the semiconductor device 100 may be an array transistor, such as a buried-channel array transistor (BCAT). In some embodiments of the present invention, the substrate 110 may be, for example, a silicon substrate, a gallium arsenide substrate, a silicon germanium substrate, or the like. In some embodiments of the present invention, the substrate 110 may be a silicon substrate on insulator (SOI) substrate. In some embodiments of the present invention, the substrate 110 may further include at least one shallow trench isolation (STI) region formed therein. In one example, the shallow trench isolation (STI) region may include silicon oxide, silicon nitride and/or silicon oxynitride.

The first trench 120 is disposed in the substrate 110 and having an inner surface 120a. The first trench 120 may have various shapes, such as a square shape, a rectangular shape, a trapezoid shape, a cylinder shape, a tube shape, and the like, but it is not limited thereto. The first trench 120 may have a depth d1 of about 100 nm to about 150 nm. It is noted that a plurality of first trenches 120 may be formed in the substrate 110 and extending along a first direction D1, as shown in FIG. 1. The first trenches 120 may be formed to be parallel with each other.

In some embodiments of the present invention, the semiconductor device 100 further includes a first insulating layer 122 disposed on and lining the inner surface 120a of the first trench 120. In some embodiments of the present invention, the first insulating layer 122 is conformally disposed on the inner surface 120a of the first trench 120. However, this is merely illustrative and thus the first insulating layer 122 is not limited to be conformally disposed on the inner surface 120a of the first trench 120.

The first insulating layer 122 may include, for example, at least one of silicon oxide, silicon nitride, and silicon oxynitride. The first insulating layer 122 may have a top surface 122a and a thickness ranged from about 1 nm to 5 nm.

The semiconductor device 100 further includes a first lower metal layer 124 disposed on the first insulating layer 122 and partially filling the first trench 120. The first lower metal layer 124 may be formed of, for example, titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), and/or a combination thereof, but is not limited thereto. In one example, the first lower metal layer 124 is titanium nitride (TiN). The first lower metal layer 124 has a height h1 (or thickness) ranged from about 10 nm to 30 nm.

The semiconductor device 100 further includes a first negative capacitance material layer 126 disposed on and lining portions of the first insulating layer 122 and the first lower metal layer 124, in which a remained portion of the first trench 120 is defined by the first negative capacitance material layer 126. In some embodiments of the present invention, the first negative capacitance material layer 126 is conformally disposed on the first insulating layer 122 and the first lower metal layer 124. However, this is merely illustrative and thus the first negative capacitance material layer 126 is not limited to be conformally disposed on the first insulating layer 122 and the first lower metal layer 124.

In some embodiments of the present invention, the first negative capacitance material layer 126 is in direct contact with the first insulating layer 122 and the first lower metal layer 124.

The first negative capacitance material layer 126 has a top surface 126a. In some embodiments of the present invention, the top surface 126a of the first negative capacitance material layer 126 is lower than the top surface 122a of the first insulating layer 122.

In some embodiments of the present invention, the first negative capacitance material layer 126 includes a ferroelectric material. In some embodiments of the present invention, the ferroelectric material may include, for example, hafnium zirconium oxide, barium titanate, zirconate titanate, barium strontium titanate, bismuth lanthanum titanate (BLT), lead zirconate titanate (PZT), and strontium bismuth tantalate (SBT), and/or a combination thereof, but is not limited thereto. In one embodiment of the present invention, the hafnium zirconium oxide is represented by a chemical formula of $Hf_xZr_{1-x}O_2$, in which x is 0.01 to 0.99, preferably 0.2 to 0.8, more preferably 0.3 to 0.7, such as 0.33, 0.35, 0.4, 0.43, 0.45, 0.48, 0.53, 0.55, 0.6, 0.63, 0.65, or 0.68, but is not limited thereto. In one embodiment of the present invention, the hafnium zirconium oxide is represented by a chemical formula of $Hf_{0.5}Zr_{0.5}O_2$.

In some embodiments of the present invention, a thickness of the first negative capacitance material layer 126 ranges from 1 nm to 5 nm, more preferably 1.5 nm to 4.5 nm, such as 2 nm, 2.5 nm, 3 nm, 3.5 nm, or 4 nm, but is not limited thereto. If the thickness of the first negative capacitance material layer 126 is greater than 5 nm, the on-current of the semiconductor device 100 may be reduced. If the thickness of the first negative capacitance material layer 126 is less than 1 nm, the semiconductor device 100 may have a higher leakage current.

It is noted that with the present of the first negative capacitance material layer 126, the read/write operation speed of the semiconductor device 100 may be increased. In other words, the semiconductor device 100 may achieve a turn-on state in a shorter time, and the semiconductor device 100 can be charged or discharged in a faster way, as compared with conventional technologies.

The semiconductor device 100 further includes a first upper metal layer 128 disposed on the first negative capacitance material layer 126 and filling the remained portion of the first trench 120. In some embodiments of the present invention, the first upper metal layer 128 may be formed of the same material or a different material from that of the first lower metal layer 124. In some embodiments of the present invention, the first upper metal layer 128 may include titanium nitride (TiN), tungsten (W), aluminum (Al), cupper (Cu), molybdenum (Mo), titanium (Ti), tantalum (Ta), and ruthenium (Ru), and/or a combination thereof, but is not limited thereto. In one example, the first upper metal layer 128 is a combination of titanium nitride (TiN) and tungsten (W).

The first upper metal layer 128 has a top surface 128a. In some embodiments of the present invention, the top surface 128a of the first upper metal layer 128 is coplanar with the top surface 126a of the first negative capacitance material layer 126.

It is noted that the first insulating layer 122, the first lower metal layer 124, the first negative capacitance material layer 126, and the first upper metal layer 128 may be referred to a first word line structure WL1 hereinafter for ease of discussion.

It is noted that with the present of the first negative capacitance material layer 126 in the first word line structure WL1, the first word line structure WL1 may have a greater total thickness, and therefore the gate-induced drain leakage (GIDL) of the semiconductor device 100 may be reduced due to the reduction of the electric field across the first insulating layer 122.

In some embodiments of the present invention, the first source/drain region 140 is disposed at one side of the first trench 120. In some embodiments of the present invention, the second source/drain region 142 is disposed at another side of the first trench 120. In other words, the first trench 120 may be interposed between the first source/drain region 140 and the second source/drain region 142. The first source/drain region 140 and the second source/drain region 142 may be formed by implanting impurity ions into the semiconductor substrate 110 at both sides of the first word line structure WL1.

In some embodiments of the present invention, the semiconductor device 100 further includes a bit line contact 150. The bit line contact 150 is disposed over the first source/drain region 140. The bit line contact 150 may include, for example, polysilicon or a metal silicide compound. The bit line contact 150 has a top surface 150a. In some embodiments of the present invention, the top surface 150a is higher than the top surface 126a of the negative capacitance material layer 126 and the top surface 128a of the upper metal layer 128.

In some embodiments of the present invention, the semiconductor device 100 further includes a cell line contact 160. The cell line contact 160 is disposed over the second source/drain region 142. The cell line contact 160 may include, for example, polysilicon or a metal silicide compound. The cell line contact 160 has a top surface 160a. In some embodiments of the present invention, the top surface 160a is higher than the top surface 126a of the negative capacitance material layer 126 and the top surface 128a of the upper metal layer 128.

In some embodiments, the semiconductor device 100 further includes a second trench 130 disposed in the substrate 110 and having an inner surface 130a. In some embodiments of the present invention, the second trench 130 may be formed in the shallow trench isolation (STI) region of substrate 110.

The second trench 130 may have various shapes, such as a square shape, a rectangular shape, a trapezoid shape, a cylinder shape, a tube shape, and the like, but it is not limited thereto. The second trench 130 has a depth d2. In some embodiments, the depth d2 may be greater than the depth d1 of the first trench 120. In other words, the first trench 120 and the second trench 130 may have bottom surfaces located at different levels from each other. For example, the bottom of the first trench 120 may be located at a higher level than the bottom of the second trench 130. In addition, a plurality of second trenches 130 may be formed in the substrate 110 and extending along the first direction D1, as shown in FIG. 1. The second trenches 130 may be formed to be parallel with each other In some embodiments of the present invention, the semiconductor device 100 further includes a second insulating layer 132 disposed on and lining the inner surface 130a of the second trench 130. In some embodiments of the present invention, the second insulating layer 132 is conformally disposed on the inner surface 130a of the second trench 130. However, this is merely illustrative and thus the second insulating layer 132 is not limited to be conformally disposed on the inner surface 130a of the second trench 130.

The second insulating layer 132 may include, for example, at least one of silicon oxide, silicon nitride, and silicon oxynitride. The second insulating layer 132 may have a top surface 132a and a thickness ranged from about 1 nm to 5 nm.

The semiconductor device 100 further includes a second lower metal layer 134 disposed on the second insulating layer 132 and partially filling the second trench 130. The second lower metal layer 134 may be formed of, for example, titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), and/or a combination thereof, but is not limited thereto. In one example, the second lower metal layer 134 is titanium nitride (TiN). The second lower metal layer 134 has a height h2 (or thickness) ranged from about 10 nm to 30 nm. It is noted that the height h2 of the second lower metal layer 134 may be less than the height h1 of the first lower metal layer 124.

The semiconductor device 100 further includes a second negative capacitance material layer 136 disposed on and lining portions of the second insulating layer 132 and the second lower metal layer 134, in which a remained portion of the second trench 130 is defined by the second negative capacitance material layer 136. In some embodiments of the present invention, the second negative capacitance material layer 136 is conformally disposed on the second insulating layer 132 and the second lower metal layer 134. However, this is merely illustrative and thus the second negative capacitance material layer 136 is not limited to be conformally disposed on the second insulating layer 132 and the second lower metal layer 134.

In some embodiments of the present invention, the second negative capacitance material layer 136 is in direct contact with the second insulating layer 132 and the second lower metal layer 134.

The second negative capacitance material layer 136 has a top surface 136a. In some embodiments of the present invention, the top surface 136a of the second negative capacitance material layer 136 is lower than the top surface 132a of the second insulating layer 132.

In some embodiments of the present invention, the second negative capacitance material layer 136 includes a ferroelectric material. In some embodiments of the present invention, the ferroelectric material may include, for example, hafnium zirconium oxide, barium titanate, zirconate titanate, barium strontium titanate, bismuth lanthanum titanate (BLT), lead zirconate titanate (PZT), and strontium bismuth tantalate (SBT), and/or a combination thereof, but is not limited thereto. In one embodiment of the present invention, the hafnium zirconium oxide is represented by a chemical formula of $Hf_xZr_{1-x}O_2$, in which x is 0.01 to 0.99, preferably 0.2 to 0.8, more preferably 0.3 to 0.7, such as 0.33, 0.35, 0.4, 0.43, 0.45, 0.48, 0.53, 0.55, 0.6, 0.63, 0.65, or 0.68, but is not limited thereto. In one embodiment of the present invention, the hafnium zirconium oxide is represented by a chemical formula of $Hf_{0.5}Zr_{0.5}O_2$.

In some embodiments of the present invention, a thickness of the second negative capacitance material layer 136 ranges from 1 nm to 5 nm, more preferably 1.5 nm to 4.5 nm, such as 2 nm, 2.5 nm, 3 nm, 3.5 nm, or 4 nm, but is not limited thereto. If the thickness of the second negative capacitance material layer 136 is greater than 5 nm, the on-current of the semiconductor device 100 may be reduced. If the thickness of the second negative capacitance material layer 136 is less than 1 nm, the semiconductor device 100 may have a higher leakage current.

It is noted that with the present of the second negative capacitance material layer 136, the read/write operation speed of the semiconductor device 100 may be increased. In other words, the semiconductor device 100 may achieve a turn-on state in a shorter time, and the semiconductor device 100 can be charged or discharged in a faster way, as compared with conventional technologies.

The semiconductor device 100 further includes a second upper metal layer 138 disposed on the second negative capacitance material layer 136 and filling the remained portion of the second trench 130. In some embodiments of the present invention, the second upper metal layer 138 may be formed of the same material or a different material from that of the second lower metal layer 134. In some embodiments of the present invention, the second upper metal layer 138 may include titanium nitride (TiN), tungsten (W), aluminum (Al), cupper (Cu), molybdenum (Mo), titanium (Ti), tantalum (Ta), and ruthenium (Ru), and/or a combination thereof, but is not limited thereto. In one example, the second upper metal layer 138 is a combination of titanium nitride (TiN) and tungsten (W).

The second upper metal layer 138 has a top surface 138a. In some embodiments of the present invention, the top surface 138a of the second upper metal layer 138 is coplanar with the top surface 136a of the second negative capacitance material layer 136.

It is noted that the second insulating layer 132, the second lower metal layer 134, the second negative capacitance material layer 136, and the second upper metal layer 138 may be referred to a second word line structure WL2 hereinafter for ease of discussion.

It is noted that with the present of the second negative capacitance material layer 136 in the second word line structure WL2, the second word line structure WL2 may have a greater total thickness, and therefore the gate-induced drain leakage (GIDL) of the semiconductor device 100 may be reduced due to the reduction of the electric field across the second insulating layer 132.

In some embodiments of the present invention, the semiconductor device 100 further includes a dielectric layer 170. The dielectric layer 170 may include, for example, silicon nitride.

Reference is now invited to FIG. 3. FIG. 3 is a plan view of the semiconductor device 100 in FIG. 1 along cut X-X' according to one embodiment of this invention.

As shown in FIG. 3, both side of the first upper metal layer 128 are adjacent to and in direct contact with the first negative capacitance material layer 126. The first negative capacitance material layer 126 may be in direct with the first insulating layer 122. In addition, both side of the second upper metal layer 138 are adjacent to and in direct contact with the second negative capacitance material layer 136. The second negative capacitance material layer 136 may be in direct with the first insulating layer 122.

Reference is now invited to FIG. 4. FIG. 4 is a three-dimensional view of the semiconductor device 100 in FIG. 1 according to one embodiment of this invention. As shown in FIG. 4, the top surface 150a of the bit line contact 150 and the top surface 160a of the cell line contact 160 are higher than that of the first word line structure WL1 and the second word line structure WL2. In addition, the top surface 150a of the bit line contact 150 is lower than the top surface 160a of the cell line contact 160.

Further, the first word line structures WL1 and the second word line structures WL2 are extended downwards in the substrate 110 along the first direction D1. In some embodiments, the first word line structure WL1 and the second word line structure WL2 are horizontally extended in a second direction D2.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a substrate;
   at least one trench having an inner surface in the substrate;
   an insulating layer lining the inner surface of the trench;
   a lower metal layer on the insulating layer and partially filling the trench;
   a negative capacitance material layer lining the insulating layer and the lower metal layer, wherein a remained portion of the trench is defined by the negative capacitance material layer, the negative capacitance material layer is made of a ferroelectric material, and a top surface of the negative capacitance material layer is lower than a top surface of the insulating layer; and
   an upper metal layer disposed on the negative capacitance material layer and filling the remained portion of the trench.

2. The semiconductor device of claim 1, wherein the insulating layer is conformally disposed on the inner surface of the trench.

3. The semiconductor device of claim 1, wherein the negative capacitance material layer is conformally disposed on the insulating layer and the lower metal layer.

4. The semiconductor device of claim 1, wherein the top surface of the negative capacitance material layer is coplanar with a top surface of the upper metal layer.

5. The semiconductor device of claim 1, wherein the negative capacitance material is in direct contact with the insulating layer and the lower metal layer.

6. The semiconductor device of claim 1, wherein the ferroelectric material comprises hafnium zirconium oxide, barium titanate, zirconate titanate, barium strontium titanate, bismuth lanthanum titanate (BLT), lead zirconate titanate (PZT), and strontium bismuth tantalate (SBT).

7. The semiconductor device of claim 6, wherein the hafnium zirconium oxide is represented by a chemical formula of $Hf_xZr_{1-x}O_2$, wherein x is 0.01 to 0.99.

8. The semiconductor device of claim 7, wherein the hafnium zirconium oxide is represented by a chemical formula of $Hf_{0.5}Zr_{0.5}O_2$.

9. The semiconductor device of claim 1, wherein a thickness of the negative capacitance material layer ranges from 1 nm to 5 nm.

10. The semiconductor device of claim 9, wherein a thickness of the negative capacitance material layer ranges from 1.5 nm to 4.5 nm.

11. The semiconductor device of claim 1, wherein the lower metal layer comprises titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN).

12. The semiconductor device of claim 1, wherein the upper metal layer comprises titanium nitride (TiN), tungsten (W), aluminum (Al), cupper (Cu), molybdenum (Mo), titanium (Ti), tantalum (Ta), ruthenium (Ru), and a combination thereof.

13. The semiconductor device of claim 1, wherein the insulating layer comprises silicon oxide, silicon nitride, and silicon oxynitride.

14. The semiconductor device of claim 1, further comprising a first source/drain region disposed at one side of the trench and a second source/drain region disposed at another side of the trench.

15. The semiconductor device of claim 14, further comprising a bit line contact disposed over the first source/drain region.

16. The semiconductor device of claim 15, wherein a top surface of the bit line contact is higher than the top surfaces of the negative capacitance material layer and the upper metal layer.

17. The semiconductor device of claim 1, further comprising a cell line contact disposed over a second source/drain region.

18. The semiconductor device of claim 17, wherein a top surface of the cell line contact is higher than the top surfaces of the negative capacitance material layer and the upper metal layer.

* * * * *